(12) United States Patent
Hishida (10) Patent No.: US 6,743,476 B2
(45) Date of Patent: Jun. 1, 2004

(54) METHOD FOR PRODUCING INDIUM TIN OXIDE FILM

(75) Inventor: Mitsuoki Hishida, Gifu (JP)

(73) Assignee: Sanyo Electric Co., Ltd. (JP)

( * ) Notice: Subject to any disclaimer, the term of this patent is extended or adjusted under 35 U.S.C. 154(b) by 99 days.

(21) Appl. No.: 10/186,355

(22) Filed: Jun. 28, 2002

(65) Prior Publication Data
US 2003/0037843 A1 Feb. 27, 2003

(30) Foreign Application Priority Data
Jun. 29, 2001 (JP) .................................. 2001-199289

(51) Int. Cl.[7] ................................................. B05D 3/00
(52) U.S. Cl. ........................ 427/271; 216/23; 427/331; 427/372.2
(58) Field of Search ..................... 216/23; 427/271, 427/331, 372.2

Primary Examiner—Bernard Pianalto
(74) Attorney, Agent, or Firm—Cantor Colburn LLP (57) ABSTRACT

An indium tin oxide (ITO) film is formed at room temperature in a moistened (water added) atmosphere, and the formed film is thermally treated at 180° C. or more for about one hour or longer. The water added atmosphere is determined to have a total partial pressure of water of about $8.2 \times 10^{-3}$ pascals or less in a film forming chamber, so that an effect of improving film quality by annealing in a later step can be produced. When a total partial pressure of water in the film forming chamber is set to $3.20 \times 10^{-3}$ pascals or more, an amorphous ITO film can be formed, and an etching treatment can be performed quickly after forming the film. A heat treatment after forming the film (patterning) is appropriately performed under conditions of a temperature of about 180° C. or more (e.g., about 220° C.) for one hour or more (e.g., about one hour to about three hours). Thus, the film is polycrystallized, and an ITO film having low resistance and high transmittance can be produced.

16 Claims, 6 Drawing Sheets

SPECIFIC RESISTANCE OF ITO vs ANNEALING TIME AT 220°C

METHOD FOR PRODUCING INDIUM TIN OXIDE FILM

BACKGROUND OF THE INVENTION

1. Field of the Invention

The present invention relates to a method for production of an indium tin oxide film which is transparent and conductive and which can be used as a transparent electrode.

2. Description of the Related Art

An indium tin oxide (hereinafter called an ITO) film is transparent when it is conductive. As a result, ITO film shave become indispensable for transparent electrodes for display devices such as liquid crystal and organic electroluminescence display devices or the like, and in other devices. This ITO film can be formed in a polycrystalline state through a process of formation in a high temperature atmosphere using a sputtering method. The resulting polycrystalline ITO film is remarkable as a transparent electrode because of its high transmittance and low resistance.

When the above ITO film is used as an individual pixel electrode of a liquid crystal display device, an organic electroluminescence display device, or the like, it is necessary to etch the formed ITO film to have a pattern of an individual electrode shape.

Meanwhile, there is a great demand that production costs of liquid crystal display devices be reduced, and this, in turn, requires improvement of production efficiency. The production efficiency of the transparent electrode may be improved by shortening an etching time when a patterning is performed.

While the ITO film in the polycrystalline state is excellent as a transparent electrode, it has a low etching rate, and therefore requires a long etching time. Meanwhile, while because the ITO film in the amorphous state has a high etching rate, the etching time can be shortened by adopting it, the amorphous ITO film has disadvantages in its high resistance, low transmittance, and poor properties as an electrode.

SUMMARY OF THE INVENTION

To deal with the above disadvantages, it is an object of the present invention to provide a method for efficiently producing an ITO film having low resistance and high transmittance.

In order to achieve the above object, the present invention forms an ITO film at room temperature in a water added atmosphere, and thermally treats the film at about 180° C. or more for about one hour or more.

The ITO film formed at room temperature in the wet atmosphere has an amorphous state, so that a desired pattern can be obtained at a high etching rate. And, after the film is formed and patterned, it is thermally treated at a temperature of about 180° C. or more (e.g., about 220° C.) for about one hour or more (e.g., about one hour to about three hours). The ITO film is polycrystallized, and it becomes possible to lower the film resistance and enhance its transmittance.

According to another embodiment of the present invention, the water added atmosphere in which the ITO film is formed meets a total partial pressure of water of about $8.20 \times 10^{-3}$ pascals or less in a film forming chamber. Here, the total partial pressure of water refers to the total of the partial pressure of positively introduced water and the partial pressure of water unintentionally introduced into the film forming chamber.

When the film forming atmosphere for the ITO film is a water added atmosphere, e.g., a total partial pressure of water of $1 \times 10^{-3}$ pascals or greater in the film forming chamber, the ITO film can be formed in the amorphous state, and the etching treatment for patterning after forming the film can be performed quickly. Further, it is possible to produce a polycrystalline ITO film having low resistance and high transmittance by thermally treating the ITO film later because the total partial pressure of water in the film forming chamber is suppressed to about $8.20 \times 10^{-3}$ pascals or less.

As described above, the present invention can produce an ITO film which can be etched quickly and is remarkable as a transparent conductive film with low resistance and high transmittance.

DESCRIPTION OF THE PREFERRED EMBODIMENT

A preferred embodiment of the present invention, hereinafter referred to simply as "the embodiment", will be described with reference to the accompanying drawings.

In this embodiment, the ITO film is directly formed on a substrate made of glass or the like by a sputtering method under conditions including room temperature and a prescribed water added (moistened) atmosphere or on a substrate on which devices such as transistors have been mounted. The ITO film produced by formation at normal temperature in the water added atmosphere as described above has an amorphous state. To produce the ITO film having the amorphous state, water content whether introduced positively or unintentionally, must be present in the film forming atmosphere regardless. The lower limit of the partial pressure of water in a film forming chamber is, for example, about $1 \times 10^{-3}$ pascals when a partial pressure of water which is introduced unintentionally is assumed to be zero (the upper limit will be described later).

The ITO film in the amorphous state has an etching rate greater than that of a polycrystalline ITO film when etching is performed to pattern it into a desired shape, for example, by wet etching with a mixture etching solution of hydrochloric acid and nitric acid. Therefore, for example, when, as described below, the ITO film is used as a pixel electrode of a liquid crystal display device, the formed amorphous ITO film can be etched in a short time to obtain a desired pixel electrode pattern. For example, when an electrode which need not be patterned separately such as a common electrode of the liquid crystal display device, is etched by removing the periphery of the substrate, the etching can be performed in a short time by first forming the ITO film in the amorphous state as described above. Even when the etching is not required, it may be configured to form the amorphous ITO film and then to perform the thermal treatment for polycrystallization as described later in order to improve the film quality.

The amorphous ITO film formed at room temperature in the water added atmosphere as described above has high resistance and low light transmittance. Accordingly, this embodiment adopts a thermal annealing treatment under conditions to be described below to treat the aforementioned amorphous ITO film so to produce the polycrystalline ITO film having low resistance and high transmittance.

Figure 1:
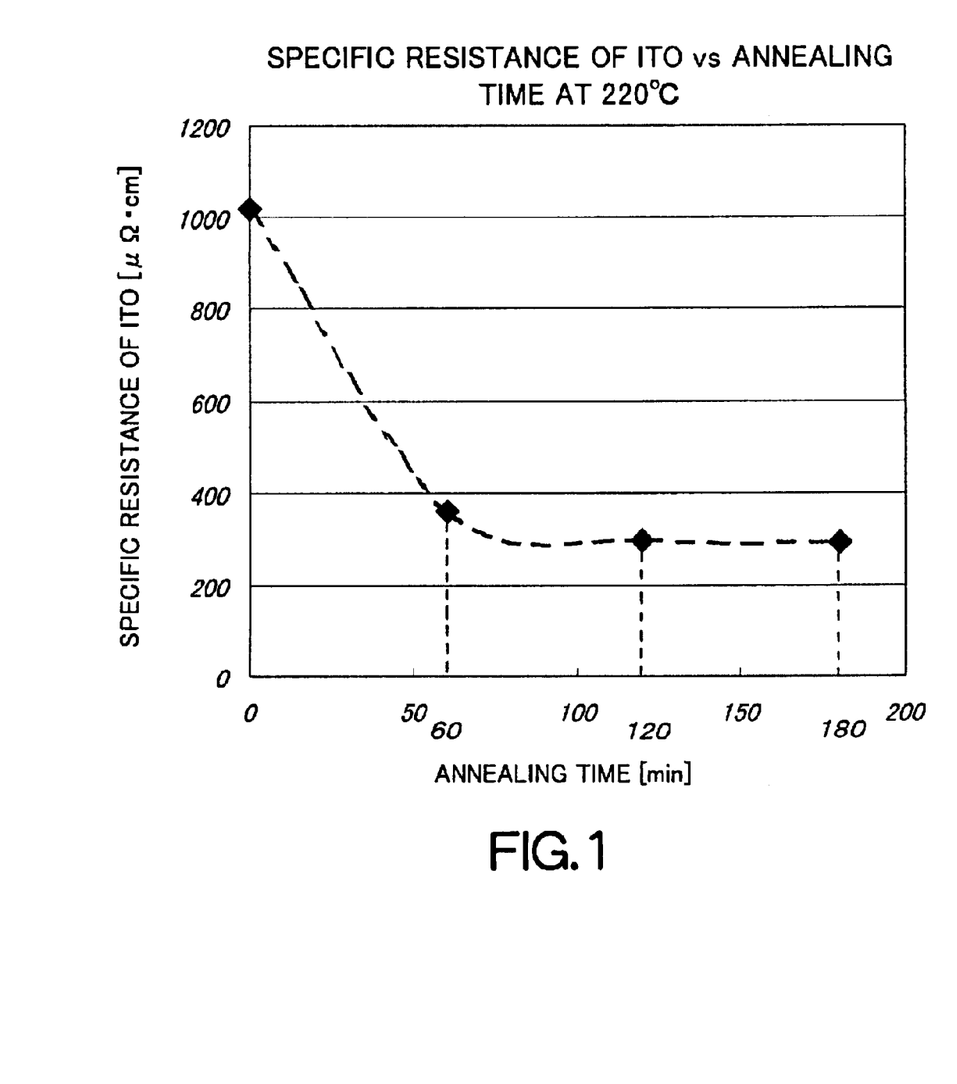
FIG. 1 is a diagram showing a relationship between a specific resistance of the ITO film and annealing time according to an embodiment of the present invention.

FIG. 1 shows a relationship between annealing time (min) at an annealing temperature of 220° C. and resistance (specific resistance: $\mu\Omega$·cm) of the ITO after the annealing. It is apparent from FIG. 1 that when the heating time is one hour or more at the heating temperature of 220° C., the ITO's specific resistance is sufficiently low, on the order of 300 $\mu\Omega$·cm to 280 $\mu\Omega$·cm, and when the heating time becomes approximately two hours, no further drop of the ITO's specific resistance is observed even if the annealing time is extended. Meanwhile, when the annealing time is in a range of less than one hour, the specific resistance drops sharply. Therefore, it is apparent that it is possibile to vary the specific resistance value of the produced ITO film be setting the annealing time at 220° C. to less than one hour.

Figure 2:
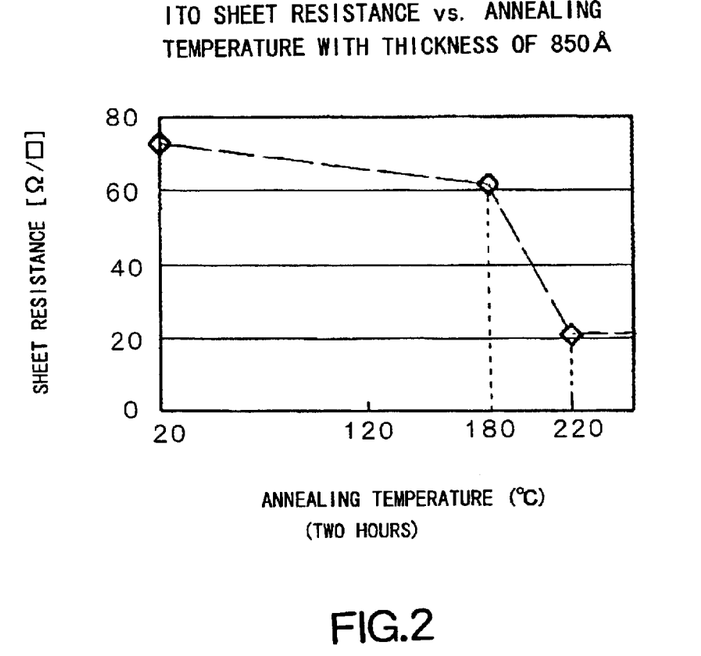
FIG. 2 is a diagram showing a relation between a sheet resistance of the ITO film and an annealing temperature according to the embodiment.

FIG. 2 shows a relationship between an annealing temperature (° C.) of the ITO film when the annealing time is set to two hours and sheet resistance ($\Omega/\square$) of the ITO film. The ITO film of FIG. 2 used for measurement has a thickness of 850 Å (85 nm). It is apparent from FIG. 2 that the annealing temperature must be set to 180° C. or more to reduce the resistance (here, the sheet resistance) of the ITO film under the annealing condition of two hours in which the ITO film has a stable resistance value indicated by the results shown in FIG. 1. It can also be seen that heating at about 220° C. is necessary to achieve the sheet resistance value of about 20 $\Omega/\square$.

It can be seen from the results of FIG. 1 and FIG. 2 that it is necessary to set the annealing time to one hour or more, and preferably about two hours, and the annealing temperature to at least 180° C., and preferably 220° C., in order to adequately reduce the resistance value of the amorphous ITO film.

Figure 3:
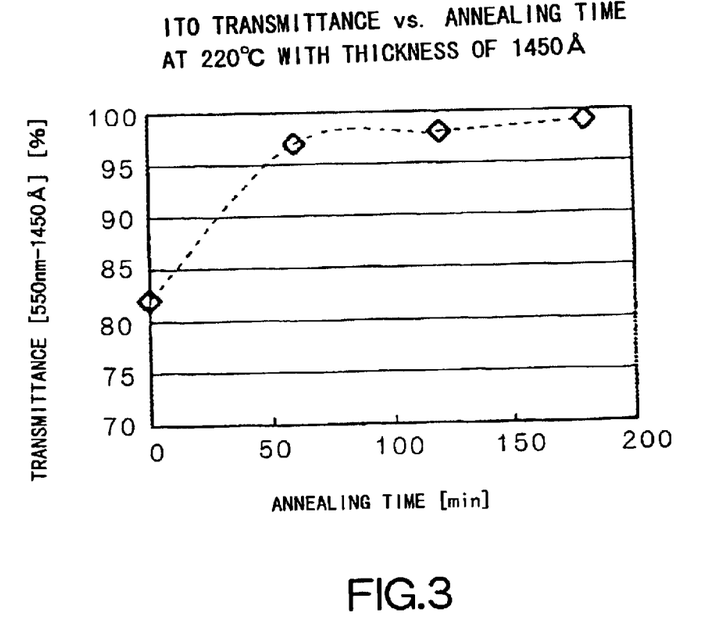
FIG. 3 is a diagram showing a relation between transmittance of the ITO film and annealing time according to the embodiment.

Then, conditions for improving the transmittance of the ITO film will be described. FIG. 3 shows a relationship between transmittance of light with a wavelength of 550 nm and the annealing time when the amorphous ITO film having thickness of 1450 Å (145 nm) is annealed at a temperature of 220° C. It is apparent from the results of FIG. 3 that the transmittance of the ITO film with at least 1450 Å to light of 550 nm becomes a very high value in a range of approximately 98% to 99% when it is annealed at 220° C. for at least one hour and preferably two hours or more. In other words, the light transmittance of the ITO film can be adequately enhanced by adopting the annealing conditions including an annealing temperature of about 220° C. and about two hours.

Here, when the ITO film has a different thickness, its transmittance spectral shape, transmittance peak wavelength, and the like vary. However, even when this happens, it is found that the transmittance can be improved by annealing the ITO film under the conditions of the annealing temperature of 220° C. and approximately two hours as described above.

It is also found that high transmittance of about 85% can be achieved over the entire visible region by annealing at about 220° C. for approximately two hours when at least the ITO film has for example substantially the same thickness of about 850 Å as does the ITO film used in FIG. 2. The ITO film having a thickness of 850 Å is used, for example, as a transparent electrode for individual pixel electrodes of the liquid crystal display device, and the ITO film having a thickness of 1450 Å (with transmittance of about 100% at a wavelength of 550 nm after the annealing) is used as a common electrode facing the above pixel electrode of the liquid crystal display device. Specifically, for the liquid crystal display device, the ITO film for the pixel electrode, which is highly demanded to be etched to have a fine pattern in a short time, can be formed in an amorphous state, etched at a high speed and annealed under the aforementioned conditions. Thus, its resistance can be lowered adequately, and very high transmittance can be realized at each wavelength.

Next, the conditions for forming the amorphous ITO film will be described. For example, although the ITO film can be formed on a glass substrate or the like by performing reactive sputtering of an indium tin alloy in an oxidation atmosphere, the ITO film can be produced in the amorphous state by forming it at room temperature and in a water added atmosphere. Here, research made by the present inventors shows that when water required to provide the amorphous state is excessive in the film forming atmosphere, the resistance cannot be lowered and the transmittance cannot be improved even if the annealing for polycrystallizing (at about 220° C. for approximately two hours) is performed later.

Although the mechanism through which the ITO film becomes conductive has not been determined, it is speculated that the presence of dangling bonds which result from bonding hands of indium atoms (In) and tin atoms (Sn) remaining in the film without bonding with oxygen may create the conductivity. Similarly, although the effect of excess moisture during film formation is not fully understood, it is presumed that dangling bonds of In and Sn in the ITO are terminated by oxygen resulting from water, such that conductivity is not improved by further annealing.

Figure 4:
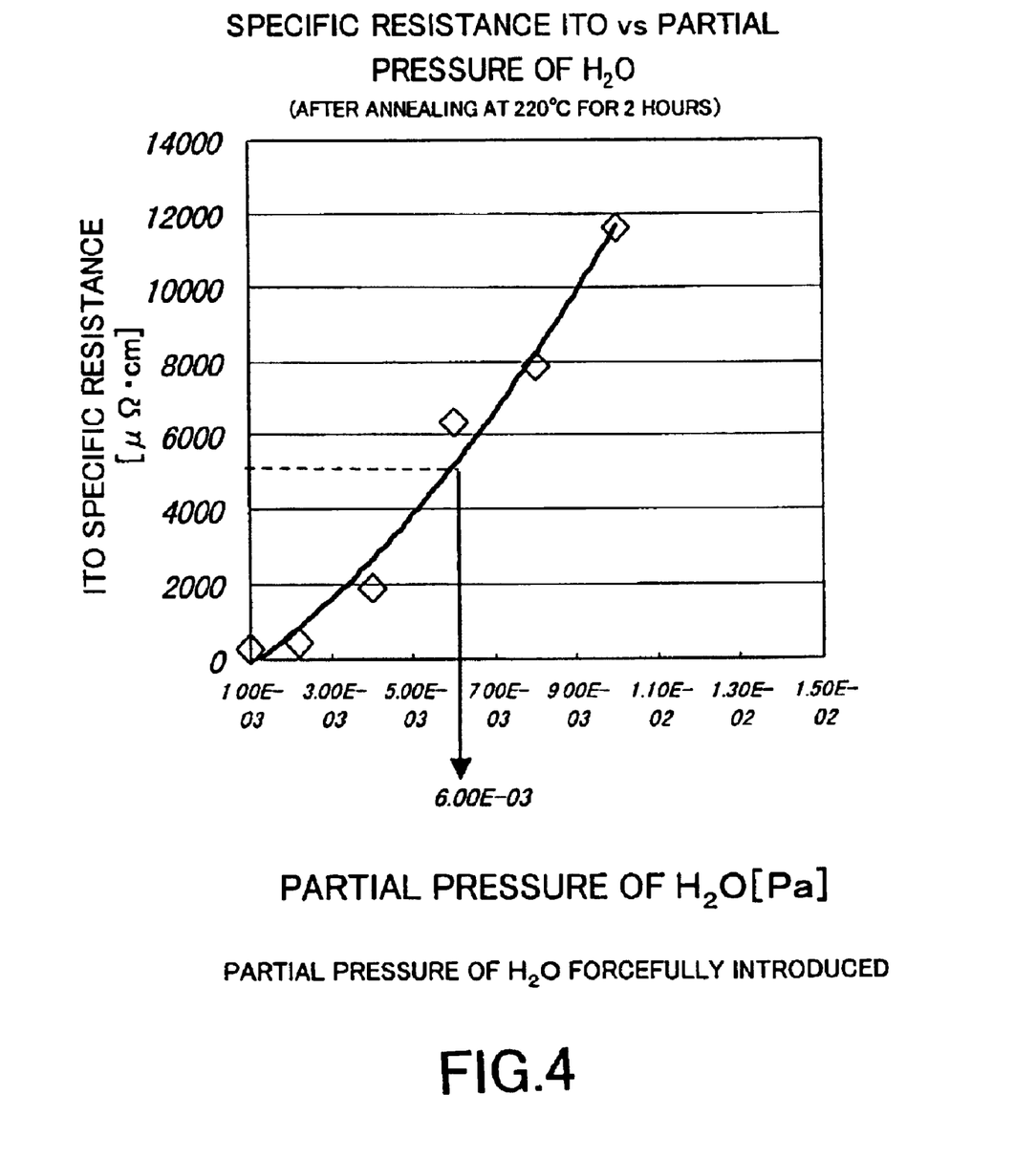
FIG. 4 is a diagram showing a relation between a sheet resistance of the ITO film and a partial pressure of water in a film forming atmosphere according to the embodiment.

FIG. 4 shows the results of measuring a relationship between a partial pressure of water introduced when the amorphous ITO film is formed and specific resistance when the amorphous ITO film is annealed at 220° C. for two hours. In FIG. 4, the partial pressure of water introduced into the film forming atmosphere indicated on the horizontal axis indicates a prescribed value of the partial pressure (Pa: pascal) of water positively introduced into the film forming chamber. It is apparent from the results of FIG. 4 that in the ITO film produced when the partial pressure of water exceeds approximately $6.00 \times 10^{-3}$ pascals, the specific resistance of the ITO drops only slightly, even after the subsequent annealing treatment. Therefore, it is necessary to set the partial pressure (prescribed value) of water introduced when the film is formed to approximately $6.00 \times 10^{-3}$ pascals or less in order to achieve an adequately low specific resistance of the ITO by subsequent annealing. The preset value for introduction is preferably about $3.00 \times 10^{-3}$ pascals. Table 1 below shows the upper and lower limits and optimum conditions of the partial pressure of water to be forcefully introduced from a mass flow into a vacuum sputtering film forming chamber.

TABLE 1

|  | Partial pressure [Pa] | Mass flow rate [sccm] |
|---|---|---|
| Upper limit of $H_2O$ | $6.00 \times 10^{-3}$ | $0.6 \times 2$ |
| Lower limit of $H_2O$ | $1.00 \times 10^{-3}$ | $0.1 \times 2$ |
| Optimum $H_2O$ condition | $3.00 \times 10^{-3}$ | $0.3 \times 2$ |

[sccm: standard cc/min]

Here, water is introduced from a dual circuit mass flow into the film forming chamber, and the mass-flow rate in the right-hand column of Table 1 indicates flow rates of water to be introduced into the film-forming chamber by the dual circuit mass flow. Film forming conditions under whcih the optimum value $3.00 \times 10^{-3}$ pascals of the above partial pressure of water can be achieved can be realized by setting, for example, a flow rate of $H_2O$ from the dual circuit mass flow to 0.3 sccm×2, a flow rate of $O_2$ from the dual circuit mass flow to 0.5 sccm×2, a flow rate of Ar from the dual circuit mass flow to 80 sccm×2 and power for electrical discharge to 2.4 kw×2.

The partial pressure of water which prevents the ITO's specific resistance from lowering by annealing must also be considered not only for water which is positively introduced (forced introduction) into the film forming chamber as described above but also water which is supplied into the film forming atmosphere unintentionally. Such water includes, for example, water content which is introduced into the film forming chamber together with a substrate on which the film is formed and a tray for conveying it and one which is contained in gas other than the water introduced into the reaction chamber.

Table 2 below shows results conforming to the actual partial pressures of water in the film forming chamber according to the partial pressure of forcefully introduced water.

TABLE 2

| Flow rate of $H_2O$ | 0 [sccm] | 0.2 × 2 [sccm] | 0.4 × 2 [sccm] | 0.6 × 2 [sccm] | 0.8 × 2 [sccm] |
|---|---|---|---|---|---|
| Partial pressure of $H_2O$ | 0 | $2.00 \times 10^{-3}$ | $4.00 \times 10^{-3}$ | $6.00 \times 10^{-3}$ | $8.00 \times 10^{-3}$ |
| Total partial pressure of $H_2O$ | $2.20 \times 10^{-3}$ | $4.20 \times 10^{-3}$ | $6.20 \times 10^{-3}$ | $8.20 \times 10^{-3}$ | $1.02 \times 10^{-2}$ |

In the sputter film forming apparatus used for measurement, the a vacuum pressure of water is $6.00 \times 10^{-5}$ pascals in the film forming chamber. Therefore, when a flow rate of $H_2O$ is zero and a partial pressure of forcefully introduced water is zero, a total partial pressure of $H_2O$ in the film forming chamber is considered to be a partial pressure of water which is introduced unintentionally because of the carrying tray and the like. Therefore, the total partial pressure of water in the film forming chamber when water is forcefully introduced by this apparatus can be predicted to be the numerical values shown in the bottom row of Table 2. Thus, it is apparent from the measured results of FIG. 4 that to allow the reduction of resistance by annealing, the total partial pressure of water in the film forming chamber must be controlled to be $1.02 \times 10^{-2}$ pascals or below corresponding to the partial pressure of forcefully introduced water of about $8.00 \times 10^{-3}$ pascals. The optimum value of the partial pressure of forcefully introduced water is approximately $3.00 \times 10^{-3}$ pascals in the aforementioned Table 1, and an optimum value of its corresponding total partial pressure of $H_2O$ is approximately $5.20 \times 10^{-3}$ pascals.

An amount of water to be introduced unintentionally into the film forming chamber varies according to the type of ITO film forming apparatus or whether a production line including this film forming apparatus has a so-called in-line structure or cluster structure. Regardless, it is desirable to control in such a way that a total amount (total partial pressure) of forcefully introduced water and unintentionally introduced water becomes $8.20 \times 10^{-2}$ pascals or less, and preferably to about $5.20 \times 10^{-3}$ pascals. To form the ITO film in the amorphous state, water having a total partial pressure of water of about $1.00 \times 10^{-2}$ pascals is necessary when it is assumed that an amount of water introduced without intention is zero as described above.

Figure 5:
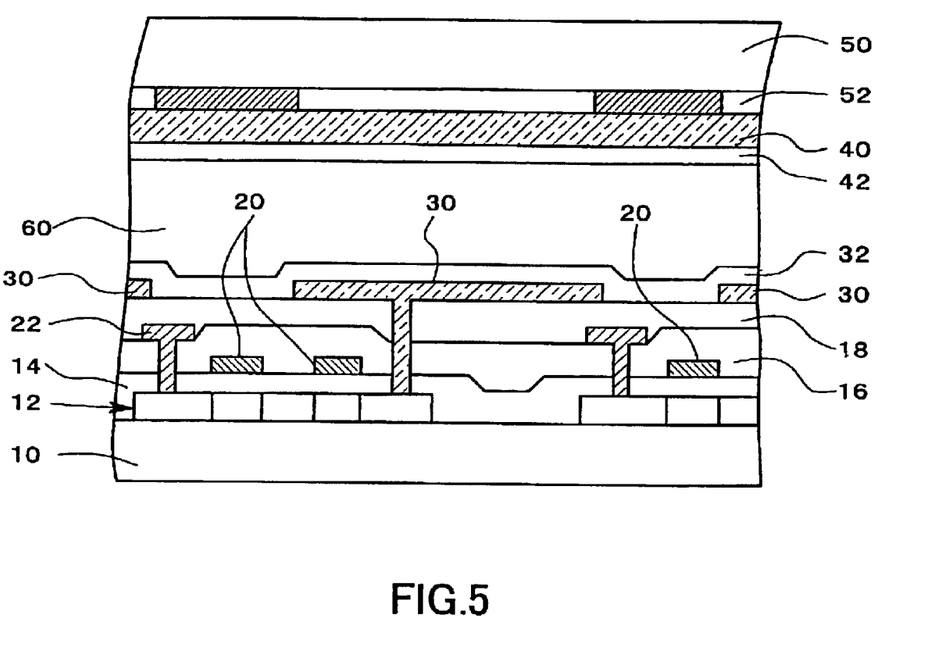
FIG. 5 is a schematic diagram showing a structure of a liquid crystal display device using the ITO film according to the embodiment.

FIG. 5 schematically shows the structure of a transmissive liquid crystal display device when the ITO film according to this embodiment is used for a display electrode of the device. The transmissive liquid crystal display device is comprised of a liquid crystal 60 filled between first and second glass substrates 10, 50 with ITO electrodes 30, 40 formed on mutually opposing sides as shown in FIG. 5. The display device of FIG. 5 has a thin film transistor (TFT) as a switching element on each pixel. In FIG. 5, the TFT has an active layer 12, which is made of polysilicon polycrystallized by laser annealing, formed on the first substrate 10 and is covered by a gate insulating film 14 and gate electrodes 20. In this case, the TFT has a so-called double gate structure to improve pressure resistance. Data electrodes (data lines) 22 are connected to the TFT active layer 12 through contact holes formed in an interlayer insulating film 16 which is formed to cover these upper layers, and a planarization insulating film 18 is formed on the entire surface of the substrate to cover the data electrodes 22.

The ITO film according to this embodiment is used for the pixel electrode 30 which is formed on the planarization insulating film 18 and connected to the TFT active layer 12 through the contact holes. The ITO pixel electrode 30 is a polycrystalline ITO film which is produced by first forming in the amorphous state on the planarization insulating film 18, etching into an individual electrode pattern for each pixel as shown in FIG. 5 and annealing at about 220° C. for about two hours, and has low resistance and high transmittance. The pixel electrode 30 produced as described above is covered with an alignment layer 32 for controlling initial orientation of the liquid crystal.

A color filter 52 is formed on the second substrate 20, and the common electrode 40 for which the ITO film of this embodiment is adopted similar to the pixel electrode 30 is formed on the color filter 52. Specifically, for the common electrode 40, the amorphous ITO film is first formed as described above, then patterned by etching as required and annealed to provide resistance reduction and high transmittance. This common electrode 40 is covered with an orientation film 42 in the same way as the first electrode 10. The common electrode 40 has a relatively large thickness of about 1450 Å as described above and tends to absorb a particular wavelength, namely tends to have coloring, as compared with the pixel electrode side. However, the annealing treatment after forming the film in the amorphous state as described above can enhance the transmittance of the ITO film to a target transmittance wavelength as high as possible, thereby further assisting achievement of a liquid crystal display device having high transmittance and remarkable color reproducibility.

The use of the ITO film according to the present invention is not limited to the display electrode of the liquid crystal display device. For example, the film can also be used for individual transparent electrodes of an organic electroluminescence display device, enabling efficient production of a transparent electrode having low resistance and remarkably high transmittance. The same effect can also be obtained by adopting the ITO film of the present invention to other transparent electrodes.

Figure 6:
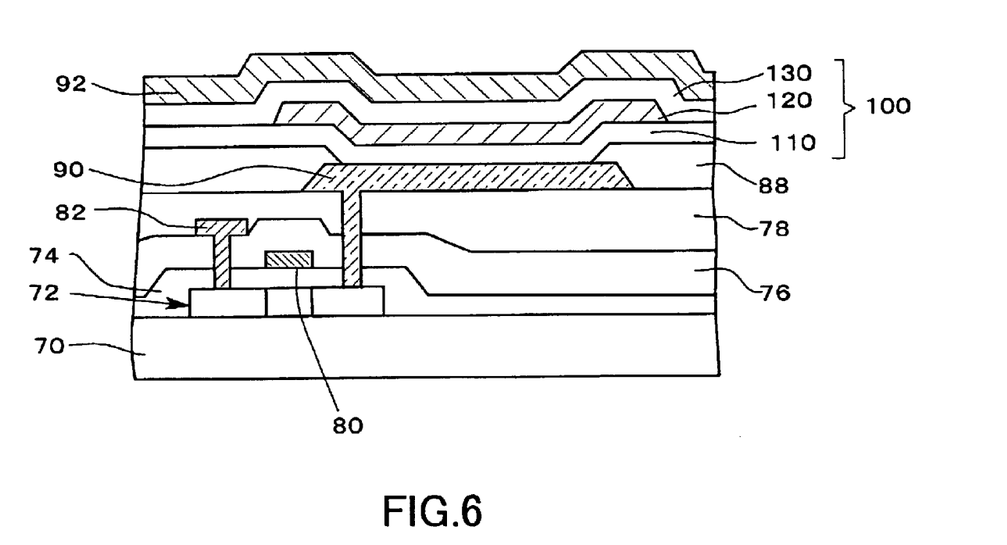
FIG. 6 is a partial sectional diagram of an organic EL display device using the ITO film according to the embodiment.

FIG. 6 shows a schematic sectional structure of one pixel of an organic electroluminescence (EL) display device to which the ITO film according to this embodiment is applied. The organic EL display device has as a light-emitting organic EL device, which is configured with an organic layer 100 including a light-emitting layer formed between a first electrode 90 and a second electrode 92, formed on each pixel. The first electrode 90 is a transparent electrode using the ITO film according to this embodiment and functions as an anode. The second electrode 92 is a metal electrode made of aluminum, its alloy, or the like and functions as a cathode. The organic layer 100 is not limited to the structure shown in FIG. 6 but maybe configured of a hole transport layer 110, a light-emitting layer 120, and an electron transport layer 130 which are stacked in order from the side of the first electrode 90.

In the example shown in FIG. 6, the light-emitting layer 120 in the organic layer 100 is somewhat larger than the first electrode 90 and formed to have a pattern for each pixel, and the hole transport layer 110 and the electron transport layer 130 are commonly formed for all pixels. Further, the second electrode 92 as the cathode is also configured commonly for all pixels, and the first electrode 90 formed of the ITO film has an individual pattern for each pixel on a first planarization insulating film 78 formed to cover the TFT as described later. After the film is formed in the amorphous state under the above-described conditions, this ITO electrode 90 is patterned by etching treatment and annealed for improvement of the film quality, also as described above. When the ITO film is etched, the electrode edge is tapered in order to prevent a line from being broken between the electrode edge and the top layer, the second electrode 92. To prevent similar line breakage, a gap and its end of the ITO electrode 90 are covered with a second planarization insulating layer 88.

Figure 7:
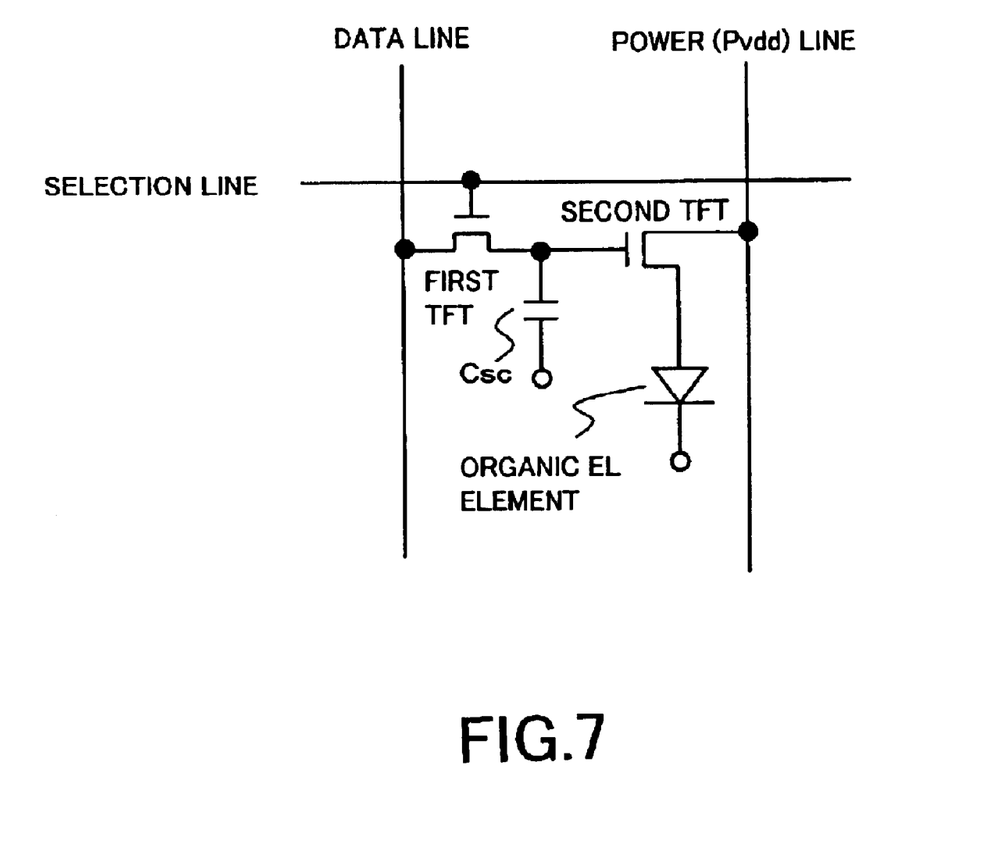
FIG. 7 is an equivalent circuit diagram of one pixel of the organic EL display device using the ITO film according to the embodiment.

In the display device shown in FIG. 6, the organic EL element is added to each pixel, and first and second TFTs are disposed as a switching element for supplying the organic EL element with a current according to display data of each pixel. The equivalent circuit of one pixel each can have the structure as shown in FIG. 7, and each pixel is provided with the first and second TFTs, a storage capacitor Csc and the organic EL element. FIG. 6 shows a sectional structure of the second TFT and the organic EL device in the equivalent circuits. The first TFT has a gate electrode connected to a selection (scan) line and is turned on by a selection signal. Electric charges according to the display data being output to the data line are accumulated in the storage capacitor Csc through a source and a drain of the first TFT. The source (or drain) of the second TFT is connected to a power line 82, and the drain (or source) is connected with the anode 90 of the organic EL element. The gate electrode 80 of the second TFT is connected to the storage capacitor Csc, and the accumulated electric charges in the storage capacitor Csc, namely a voltage corresponding to the display data is applied to the gate electrode. Therefore, a current corresponding to the display data is supplied from a power supply Pvdd to the first electrode 90 of the organic EL element, holes in an amount corresponding to the amount of current supplied from the first electrode 90 through the hole transport layer 110 are injected into the light-emitting layer 120, and electrons are also injected from the second electrode 92 into the light-emitting layer 120 through the electron transport layer 130. The holes and the electrons are rebounded in the light-emitting layer 120 to excite organic light-emitting molecules to resume a base state. Thus, light is emitted.

The second TFT and the first TFT which is not shown in FIG. 6 have a similar structure including an active layer 72 which is formed of polysilicon or the like polycrystallized by laser annealing and formed on a transparent substrate 70 of glass or the like, and a gate insulating film 74 and a gate electrode 80 which are formed to cover the active layer 72. The source (or drain) of the second TFT is connected to the power line 82 through the contact hole formed through the interlayer insulating film 76 and the gate insulating film 74 which are formed to cover the entire TFT, and the first planarization insulating film 78 is formed on the entire substrate to cover the power line 82.

The first electrode 90 formed of the ITO film as described above is formed on the first planarization insulating film 78, the drain (or source) of the second TFT and the first electrode 90 are connected through the contact hole formed through the first planarization insulating film 78, the interlayer insulating film 76 and the gate insulating film 74.

While there has been described that what is at present considered to be a preferred embodiment of the invention, it is to be understood that various modifications may be made thereto, and it is intended that the appended claims cover all such modifications as fall within the true spirit and scope of the invention.

What is claimed is:

1. A method for producing an indium tin oxide film, comprising:

forming the indium tin oxide film at room temperature in a water added atmosphere; and performing a heat treatment of the formed film at about 180° C. or more for about one hour or longer.

2. The method for producing an indium tin oxide film according to claim 1, wherein the indium tin oxide film formed at room temperature in the water added atmosphere is in an amorphous state and polycrystallized by the heat treatment.

3. The method for producing an indium tin oxide film according to claim 1, wherein the total partial pressure of the water content in the water added atmosphere in which the indium tin oxide film is formed is about $8.20 \times 10^{-3}$ pascals or less in a film forming chamber.

4. The method for producing an indium tin oxide film according to claim 3, wherein the total partial pressure of the water content in the water added atmosphere in which the indium tin oxide film is formed is about $1 \times 10^{-3}$ pascals or more in the film forming chamber.

5. The method for producing an indium tin oxide film according to claim 1, wherein the total partial pressure of the water content in the water added atmosphere in which the indium tin oxide film is formed is about $5.20 \times 10^{-3}$ pascals in the film forming chamber.

6. A method for producing an indium tin oxide film, comprising:

forming the indium tin oxide film at room temperature in a water added atmosphere; and performing a heat treatment of the formed film at a temperature of about 220° C. for a length of time from about one hour to about three hours.

7. The method for producing an indium tin oxide film according to claim 6, wherein the indium tin oxide film formed at room temperature in the water added atmosphere is in an amorphous state and polycrystallized by the heat treatment.

8. The method for producing an indium tin oxide film according to claim 6, wherein the total partial pressure of the water content in the water added atmosphere in which the indium tin oxide film is formed is about $8.20 \times 10^{-3}$ pascals or less in a film forming chamber.

9. The method for producing an indium tin oxide film according to claim 8, wherein the total partial pressure of the water content in the water added atmosphere in which the indium tin oxide film is formed is about $1 \times 10^{-3}$ pascals or more in the film forming chamber.

10. The method for producing an indium tin oxide film according to claim 6, wherein the total partial pressure of the water content in the water added atmosphere in which the indium tin oxide film is formed is about $5.20 \times 10^{-3}$ pascals in the film forming chamber.

11. A method for producing an indium tin oxide film, comprising:

forming the indium tin oxide film at room temperature in a water added atmosphere;

patterning the formed film by etching; and performing a heat treatment at about 180° C. or more for about one hour or more.

12. The method for producing an indium tin oxide film according to claim 11, wherein the heat treatment is performed at a temperature of about 220° C. for a length of time from about one hour to about three hours.

13. The method for producing an indium tin oxide film according to claim 11, wherein the indium tin oxide film formed at room temperature in the water added atmosphere is in an amorphous state and polycrystallized by the heat treatment.

14. The method for producing an indium tin oxide film according to claim 11, wherein the total partial pressure of the water content in the water added atmosphere in which the indium tin oxide film is formed is about $8.20 \times 10^{-3}$ pascals or less in a film forming chamber.

15. The method for producing an indium tin oxide film according to claim 14, wherein the total partial pressure of the water content in the water added atmosphere in which the indium tin oxide film is formed is about $1 \times 10^{-3}$ pascals or more in the film forming chamber.

16. The method for producing an indium tin oxide film according to claim 11, wherein the water total partial pressure of the water content in the water added atmosphere in which the indium tin oxide film is formed is about $5.20 \times 10^{-3}$ pascals in the film forming chamber.

* * * * *